(12) United States Patent
Cousineau et al.

(10) Patent No.: US 10,780,498 B2
(45) Date of Patent: Sep. 22, 2020

(54) POROUS TOOLS AND METHODS OF MAKING THE SAME

(71) Applicant: General Electric Company, Schenectady, NY (US)

(72) Inventors: Nolan Leander Cousineau, West Chester, OH (US); Nathan Carl Sizemore, Hamilton, OH (US)

(73) Assignee: General Electric Company, Schenectady, NY (US)

( * ) Notice: Subject to any disclaimer, the term of this patent is extended or adjusted under 35 U.S.C. 154(b) by 10 days.

(21) Appl. No.: 16/108,657

(22) Filed: Aug. 22, 2018

(65) Prior Publication Data

US 2020/0061709 A1    Feb. 27, 2020

(51) Int. Cl.
*B22F 3/105* (2006.01)
*B22F 5/00* (2006.01)
(Continued)

(52) U.S. Cl.
CPC ............ *B22F 3/1055* (2013.01); *B22F 5/007* (2013.01); *B22F 5/009* (2013.01); *C23C 14/50* (2013.01);
(Continued)

(58) Field of Classification Search
CPC .......... B22F 5/007; B22F 5/009; B22C 9/065; B22D 25/06; B29C 33/3828
See application file for complete search history.

(56) References Cited

U.S. PATENT DOCUMENTS

| 4,047,873 A | 9/1977 | Farrell |
| 4,208,177 A | 6/1980 | Allen |
(Continued)

FOREIGN PATENT DOCUMENTS

| CN | 106513996 A | 3/2017 |
| DE | 102009016110 A1 | 10/2010 |
| GB | 636818 | 5/1950 |

OTHER PUBLICATIONS

Appleby, et al., Tomo-Lithographic-Molding (TLM-TM)—A Breakthrough Manufacturing Process for Large Area Micro-Mechanical Systems, 2005, 5 pages. https://esto.nasa.gov/conferences/estc2005/papers/b1p2.pdf.

(Continued)

*Primary Examiner* — Xiao S Zhao
*Assistant Examiner* — Emmanuel S Luk
(74) *Attorney, Agent, or Firm* — Dority & Manning, P.A.

(57) ABSTRACT

A porous tool includes a mold body and an additively-manufactured film attached to a surface of the mold body. The film includes a porous layer and a nonporous support layer. The porous layer may include a surface having an array of surface pore openings, a network of interconnected passages in fluid communication with the surface pore openings, and one or more lateral edges that have an array of edge pore openings in fluid communication with the interconnected passages. Methods of forming a porous tool include depositing additive material on a build surface using a directed energy deposition system to form a film while simultaneously subtracting selected portions of the additive material from the film using laser ablation. Methods of forming a molded component include conforming a moldable material to a shape using a porous tool that includes a mold body and an additively-manufactured film, and evacuating outgas from the moldable material through a porous layer of the film.

18 Claims, 11 Drawing Sheets

(51) Int. Cl.
  *C23C 14/50* (2006.01)
  *C23C 16/448* (2006.01)
  *B33Y 10/00* (2015.01)
  *B33Y 80/00* (2015.01)
  *B22C 7/02* (2006.01)
  *C23C 16/52* (2006.01)
(52) U.S. Cl.
  CPC ............ *C23C 16/4485* (2013.01); *B22C 7/02* (2013.01); *B33Y 10/00* (2014.12); *B33Y 80/00* (2014.12); *C23C 16/52* (2013.01)

(56) References Cited

U.S. PATENT DOCUMENTS

| | | | |
|---|---|---|---|
| 4,783,341 A | | 11/1988 | Packer et al. |
| 4,863,538 A | * | 9/1989 | Deckard ............... B33Y 10/00 264/497 |
| 5,031,483 A | * | 7/1991 | Weaver ................ B21D 37/20 451/5 |
| 5,076,869 A | * | 12/1991 | Bourell ............... B33Y 70/00 264/497 |
| 5,147,587 A | * | 9/1992 | Marcus ............... B33Y 10/00 264/434 |
| 5,169,678 A | * | 12/1992 | Cole ...................... G03F 7/039 216/17 |
| 5,207,371 A | * | 5/1993 | Prinz ..................... B22F 3/008 228/125 |
| 5,286,573 A | * | 2/1994 | Prinz ..................... B22F 3/115 264/308 |
| 5,411,772 A | | 5/1995 | Cheung |
| 5,449,427 A | * | 9/1995 | Wojnarowski ........ H01L 21/481 156/155 |
| 5,508,065 A | * | 4/1996 | Weiner .................. C23C 14/28 427/250 |
| 5,850,590 A | | 12/1998 | Furuta et al. |
| 5,858,876 A | | 1/1999 | Chew |
| 6,112,804 A | * | 9/2000 | Sachs ..................... B22C 9/065 164/348 |
| 6,136,725 A | | 10/2000 | Loan et al. |
| 6,210,986 B1 | | 4/2001 | Arnold et al. |
| 6,359,367 B1 | | 3/2002 | Sumanaweera et al. |
| 6,399,177 B1 | | 6/2002 | Fonash et al. |
| 6,619,369 B2 | | 9/2003 | Takayanagi |
| 6,865,140 B2 | | 3/2005 | Thomenius et al. |
| 6,951,453 B2 | | 10/2005 | Neter et al. |
| 7,141,812 B2 | | 11/2006 | Appleby et al. |
| 7,332,425 B2 | | 2/2008 | Haider et al. |
| 7,410,606 B2 | | 8/2008 | Appleby et al. |
| 7,473,086 B2 | | 1/2009 | Balaschak et al. |
| 7,893,413 B1 | | 2/2011 | Appleby et al. |
| 8,124,245 B2 | * | 2/2012 | Budinger ................ B22F 7/08 428/550 |
| 9,315,663 B2 | | 4/2016 | Appleby et al. |
| 9,550,349 B1 | | 1/2017 | Larsen et al. |
| 9,776,282 B2 | * | 10/2017 | Subramanian .......... B28B 1/001 |
| 9,903,590 B2 | | 2/2018 | Garry et al. |
| 2001/0048988 A1 | | 12/2001 | Forte et al. |
| 2003/0157271 A1 | * | 8/2003 | Duignan ............... C23C 14/048 427/596 |
| 2004/0094728 A1 | * | 5/2004 | Herzog .................. B22F 3/1055 250/559.06 |
| 2004/0191106 A1 | * | 9/2004 | O'Neill ............... A61F 2/30907 419/2 |
| 2006/0000709 A1 | * | 1/2006 | Bohm ............... B01L 3/502738 204/403.01 |
| 2006/0257511 A1 | * | 11/2006 | Iwamoto .................. B22F 5/007 425/35 |
| 2010/0044547 A1 | * | 2/2010 | Higashi .................... B22F 3/003 249/79 |
| 2011/0132562 A1 | | 6/2011 | Merrill et al. |
| 2012/0212793 A1 | * | 8/2012 | Andersson Ersman ..................... G02F 1/1533 359/268 |
| 2014/0010951 A1 | | 1/2014 | Vargas et al. |
| 2014/0014286 A1 | | 1/2014 | Suzuki et al. |
| 2015/0241062 A1 | | 8/2015 | Harding |
| 2015/0283642 A1 | * | 10/2015 | Forsdike ............... B23K 20/233 219/78.02 |
| 2016/0023375 A1 | * | 1/2016 | Uram ...................... B29C 39/36 264/133 |
| 2016/0031010 A1 | * | 2/2016 | O'Neill ................. B29C 64/153 419/28 |
| 2016/0038866 A1 | | 2/2016 | Gibson et al. |
| 2016/0257052 A1 | | 9/2016 | Sun et al. |
| 2016/0318129 A1 | * | 11/2016 | Hu ......................... B29C 64/182 |
| 2016/0351343 A1 | * | 12/2016 | Lindstrom ........... H01G 9/2022 |
| 2017/0001340 A1 | * | 1/2017 | Koyanagi ........... B29C 33/3828 |
| 2017/0022111 A1 | * | 1/2017 | Jarvis ................. C04B 35/58085 |
| 2017/0137313 A1 | * | 5/2017 | Bisson .................... C03B 11/06 |
| 2017/0173671 A1 | * | 6/2017 | Auxier .................... B33Y 10/00 |
| 2017/0299181 A1 | | 10/2017 | Graichen et al. |
| 2017/0348107 A1 | * | 12/2017 | Lee ....................... A61F 2/30767 |
| 2018/0029107 A1 | | 2/2018 | Bewlay et al. |
| 2018/0056395 A1 | * | 3/2018 | Hofacker ............... B22F 3/1055 |
| 2018/0141174 A1 | * | 5/2018 | Mori ..................... B23K 26/354 |
| 2018/0161856 A1 | | 6/2018 | Yang et al. |
| 2018/0200795 A1 | * | 7/2018 | Morimoto ............... B29C 33/38 |
| 2018/0214948 A1 | * | 8/2018 | Morimoto ................. B22F 3/16 |
| 2018/0221952 A1 | * | 8/2018 | Yoshida ................. B33Y 10/00 |
| 2018/0297901 A1 | * | 10/2018 | Droz ......................... B28B 1/24 |
| 2018/0347541 A1 | * | 12/2018 | Kudsk .................. F03D 1/0675 |
| 2018/0369961 A1 | * | 12/2018 | Ishikawa ............... B23K 26/082 |
| 2019/0061258 A1 | * | 2/2019 | Kulinsky .............. B29C 64/188 |
| 2019/0091923 A1 | * | 3/2019 | Abe ...................... B29C 64/153 |
| 2019/0217386 A1 | * | 7/2019 | Morimoto ............... B22F 3/105 |
| 2019/0329356 A1 | | 10/2019 | Zhang et al. |

OTHER PUBLICATIONS

European Search Report Corresponding to Application No. 19192360 dated Feb. 10, 2020.

\* cited by examiner

POROUS TOOLS AND METHODS OF MAKING THE SAME

FIELD

The present disclosure pertains to porous tools such as porous films and layup tools that have an integrally formed porous structure, as well as methods of making such porous tools using composite fabrication and/or additive manufacturing processes.

BACKGROUND

Porous films have been made using sintering processes to create randomly oriented holes in a film. However, sintering processes tend to produce pores that have a distribution of sizes and depths, including pores that dead-end or otherwise fall short of their desired depth. Consequently, porous films made using sintering processes have a degree of variability and/or unpredictability which may be unsuitable for certain applications.

Molding technologies such as composite fabrication and additive manufacturing technologies utilize porous films in various processes such as debulking, autoclaving, curing, and/or pyrolysis processes. Porous films may be used in such processes as a filter to separate and evacuate outgas while preventing other materials from passing therethrough. For example, in some processes, a moldable material, such as a composite or additive manufacturing material, may be formed over a layup tool and a porous film sometimes referred to as a breather film may be placed on or around the layup tool. The resulting assembly of the layup tool, the moldable material, and the porous film may be placed in a debulking, autoclaving, curing, and/or pyrolysis system, with outgas being evacuated through the breather film. Typically the breather film is regarded as a disposable product, and may be discarded after even a single use, which causes an accumulation of waste material.

Accordingly, there exists a need for improved porous tools such as porous films and layup tools that have an integrally formed porous structure, and improved methods of making such porous tools.

BRIEF DESCRIPTION

Aspects and advantages will be set forth in part in the following description, or may be obvious from the description, or may be learned through practicing the presently disclosed subject matter.

In one aspect, the present disclosure embraces porous tools. An exemplary porous tool includes a mold body and an additively-manufactured film attached to a surface of the mold body. The film includes a porous layer and a nonporous support layer. The porous layer may have a thickness of from 100 to 1,000 microns. the nonporous support layer may have a thickness of from 1 to 25 millimeters. The porous layer may include a surface having an array of surface pore openings, a network of interconnected passages in fluid communication with the surface pore openings, and one or more lateral edges that have an array of edge pore openings in fluid communication with the interconnected passages.

In another aspect, the present disclosure embraces methods of forming a porous tool. An exemplary method includes depositing additive material on a build surface using a directed energy deposition system to form a film while simultaneously subtracting selected portions of the additive material from the film using laser ablation to form a porous layer in the film, in which the porous layer includes a network of interconnected passages.

In yet another aspect, the present disclosure embraces methods of forming a molded component. An exemplary method includes conforming one or more moldable materials to a shape using a porous tool that includes a mold body and an additively-manufactured film. The additively-manufactured film may be attached to a surface of the mold body or integrally formed as part of the mold body. The exemplary method includes evacuating outgas from the one or more moldable materials through a porous layer of the film. The porous layer may have a thickness of from 100 to 1,000 microns. The film may additionally include a nonporous support layer, which may have a thickness of from 1 to 25 millimeters. The evacuating outgas may enter the porous layer through an array of surface pore openings located at a surface of the film in contact with the one or more moldable materials. The outgas may traverse the porous layer through a network of interconnected passages, and exit the porous layer through an array of edge pore openings located at one or more lateral edges of the film.

These and other features, aspects and advantages will become better understood with reference to the following description and appended claims. The accompanying drawings, which are incorporated in and constitute a part of this specification, illustrate exemplary embodiments and, together with the description, serve to explain certain principles of the presently disclosed subject matter.

BRIEF DESCRIPTION OF THE DRAWINGS

A full and enabling disclosure, including the best mode thereof, directed to one of ordinary skill in the art, is set forth in the specification, which makes reference to the appended Figures, in which:

FIG. 2A-3C are a flowcharts depicting steps in an exemplary method of forming a porous tool;

FIGS. 3A-3I show a series of cross-sectional views of various layers an exemplary porous tool;

Figure 1A:
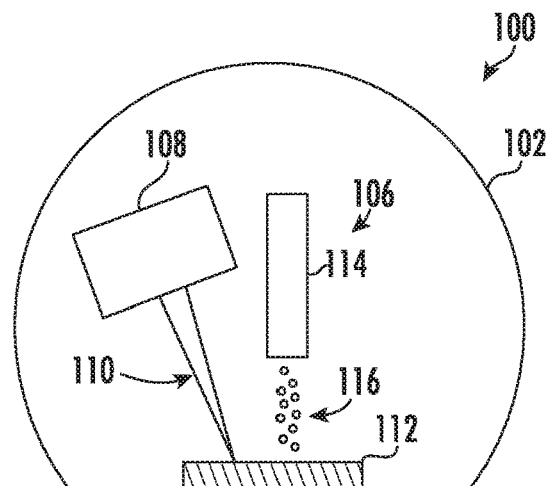
FIGS. 1A-1C show exemplary porous-tool manufacturing systems for forming a porous tool.

Repeat use of reference characters in the present specification and drawings is intended to represent the same or analogous features or elements of the present disclosure.

DETAILED DESCRIPTION

Reference now will be made in detail to exemplary embodiments of the presently disclosed subject matter, one or more examples of which are illustrated in the drawings. Each example is provided by way of explanation and should not be interpreted as limiting the present disclosure. In fact, it will be apparent to those skilled in the art that various modifications and variations can be made in the present disclosure without departing from the scope or spirit of the present disclosure. For instance, features illustrated or described as part of one embodiment can be used with another embodiment to yield a still further embodiment. Thus, it is intended that the present disclosure covers such modifications and variations as come within the scope of the appended claims and their equivalents.

The present disclosure generally pertains to porous tools for use in forming composite or additively manufactured components, as well as methods of forming such porous tools and methods of using such porous tools to form a molded component. In exemplary embodiments, the porous tool may embody a filter and/or a layup tool that has an integrally formed porous structure. The presently disclosed porous tools include a mold body and an additively-manufactured film which may be attached to a surface of the mold body or integrally formed together with the mold body. The additively-manufactured film includes a porous layer having a porous surface with an array of surface pore openings, a network of interconnected passages in fluid communication with the surface pore openings, and one or more lateral edges that have an array of edge pore openings in fluid communication with the interconnected passages. The porous layer may include any desired porous structure. The porous surface may include one or more contours configured to conform a moldable material, such as a composite material or additive manufacturing material, to a shape defined by the one or more contours. The porous layer allows outgas to escape from the moldable material during a composite fabrication and/or additive manufacturing process. For example, outgas may escape through the porous layer while conforming the moldable material to the porous surface of the porous tool. The porous structure may be configured and arranged to provide a specific desired mass flux of outgas at a given temperature and pressure.

Advantageously, the presently disclosed porous tools may be tailored for a specific composite or additive manufacturing process and/or for a specific composite or additively manufactured component, allowing for improved performance and reliability. For example, the presently disclosed porous tools may provide a more uniform mass flux of outgas as between different portions of the porous tool, which may provide a more uniform or enhanced density of the component and/or a more uniform or enhanced strength properties of the component. A more uniform mass flux of outgas may also reduce processing time allocated to processes that involve outgas evacuation and/or may provide more consistent processing times, which in turn may also contribute to more uniform or enhanced density and/or strength properties. Additionally, the presently disclosed porous tools may replace breather film commonly placed around layup tools to evacuate outgas in debulking, autoclaving, curing, and/or pyrolysis processes. Breather film is generally regarded as a disposable product, and so the presently disclosed porous tools may advantageously reduce or eliminate waste material.

The presently disclosed porous tools may be formed using a porous-tool manufacturing system which includes an additive material source and an energy source configured to be cooperatively or simultaneously operated to produce a porous tool layer by layer. Exemplary methods of forming a porous tool include depositing additive material on a build surface while simultaneously subtracting selected portions of the additive material to form a porous layer. Advantageously, the cooperative or simultaneous operation of the porous-tool manufacturing system may provide faster production times for producing porous tools, while also providing improved precision such as by eliminating variability and/or unpredictability associated with sintering processes. Additionally, the presently disclosed porous tools may be used in methods of forming a molded component, advantageously allowing for more uniform evacuation of outgas and elimination of disposable breather film.

It is understood that terms such as "top", "bottom", "outward", "inward", and the like are words of convenience and are not to be construed as limiting terms. As used herein, the terms "first", "second", and "third" may be used interchangeably to distinguish one component from another and are not intended to signify location or importance of the individual components. The terms "a" and "an" do not denote a limitation of quantity, but rather denote the presence of at least one of the referenced item.

Here and throughout the specification and claims, range limitations are combined and interchanged, and such ranges are identified and include all the sub-ranges contained therein unless context or language indicates otherwise. For example, all ranges disclosed herein are inclusive of the endpoints, and the endpoints are independently combinable with each other.

Approximating language, as used herein throughout the specification and claims, is applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value, or the precision of the methods or machines for constructing or manufacturing the components and/or systems.

Figure 1B:
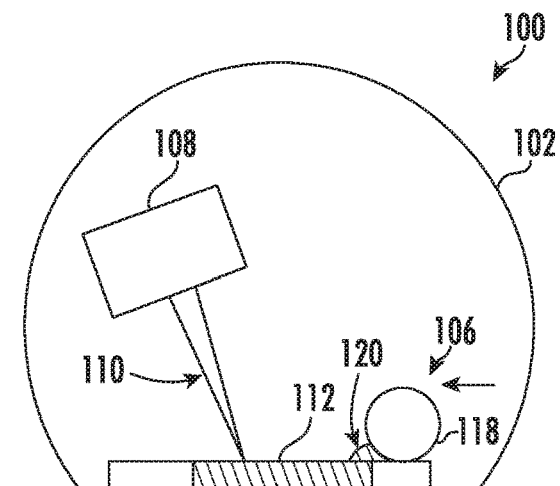
Figure 1C:
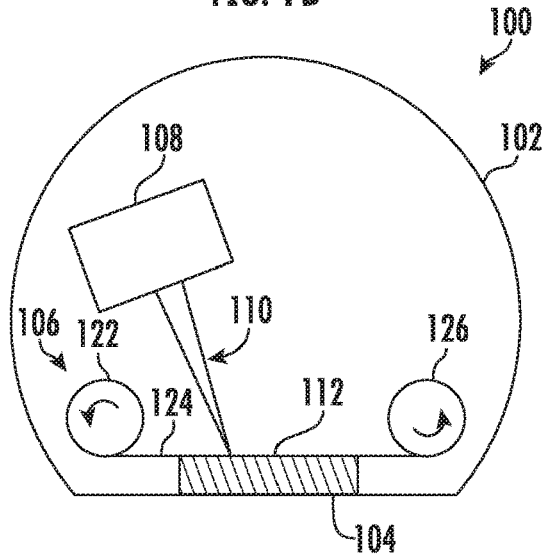

Now referring to FIGS. 1A-1C, various embodiments of an exemplary porous-tool manufacturing system 100 are shown. Exemplary porous-tool manufacturing systems 100 include an additive manufacturing technology. As shown in FIG. 1A, a porous-tool manufacturing system 100 may include a directed energy deposition (DED) system, such as a chemical vapor deposition (CVD) system, a laser engineered net shape (LENS) system, an electron beam additive melting (EBAM) system, or a rapid plasma deposition (RPD) system. As shown in FIG. 1B, a porous-tool manufacturing system 100 may include a powder bed fusion (PBF) system, such as a direct metal laser melting (DMLM) system, an electron beam melting (EBM) system, a directed metal laser sintering (DMLS) system, a selective laser melting (SLM) system, or a selective laser sintering (SLS) system. As shown in FIG. 1C, a porous-tool manufacturing system 100 may include a laminated object manufacturing (LOM) system, such as an ultrasonic manufacturing (UAM) system. Exemplary porous-tool manufacturing systems 100 are sometimes referred to generally herein as a system 100 for convenience.

An exemplary system 100 includes a processing chamber 102, a build platform 104, an additive material source 106, and an energy source 108 configured to emit an energy beam 110. The additive material source 106 and the energy source 108 may be cooperatively or simultaneously operated to produce a porous tool 112 layer by layer on the build platform 104 as described herein. Exemplary energy sources 108 may be configured to emit a beam 110 such as a laser beam, an electron beam, a plasma arc, or the like. The energy source 108 may be utilized in an additive process, such as to bind additive material from the additive material source 106. Exemplary additive processes of the energy source 108 may include reacting, sintering, melting, curing, or the like as applicable to the particular system 100. Additionally, or in the alternative, the energy source 108 may be utilized in a subtractive process, such as to remove additive material so as to form the porous tool. The subtractive process may include ablation, evaporation, sublimation, micromachining, or the like as applicable to the particular system 100. In an exemplary embodiment, a porous-tool manufacturing system 100 may include a directed energy deposition system and a laser ablation system.

The exemplary systems 100 described herein are provided by way of example only and are not to be taken in a limiting sense. Rather, it will be appreciated that various other systems may be utilized alone or in combination, including combinations of the exemplary systems shown in FIGS. 1A-1C and described herein, all of which are within the spirit and scope of the present disclosure. While the exemplary systems 100 show one energy source 108, it will be appreciated that in fact one or more energy sources 108 such as a plurality of energy sources 108 may be provided. For example, a first energy source 108 may be provided for an additive process, and a second energy source 108 may be provided for a subtractive process. Alternatively, or in addition, a common energy source 108 may be utilized for both an additive process and a subtractive process.

When an exemplary system 100 includes a directed energy deposition (DED) system as shown in FIG. 1A, the processing chamber 102 may embody a deposition chamber. The additive material source 106 may include a nozzle 114 configured to supply a stream 116 of additive material, which may include a gas, a powder, a wire or filament material, or the like as applicable to the particular DED system. The energy source 108 may be utilized in an additive process and/or a subtractive process. For example, in an additive process, the energy source 108 may emit a beam used to vaporize material to be deposited on a build surface, such as a build platform 104 or a surface of the porous tool 112. Additionally, or in the alternative, the energy source 108 may be utilized in a subtractive process, including ablation, evaporation, sublimation, or micromachining. In an exemplary embodiment, the energy source 108 includes a laser and the beam 110 is a laser beam configured to perform laser ablation. With a chemical vapor deposition (CVD) system, a substrate (not shown) situated on the build platform 104 may be exposed to a stream 116 of additive material in the form of a precursor material, which may react and/or decompose on the substrate to produce a thin film of additive material. The precursor material may include a gas, a liquid/gas aerosol, a liquid, a liquid dissolved in a solvent, or the like as applicable to the particular CVD system. Any CVD system may be utilized in accordance with the present disclosure, including a low pressure CVD system ultrahigh vacuum CVD system, each of which operate with the processing chamber providing a negative-pressure environment. In the case of an ultrahigh vacuum CVD system, the processing chamber 102 may provide a negative pressure environment, such as a pressure below $10^{-6}$ Pa, such as below $10^{-7}$ Pa.

With a laser engineered net shape (LENS) system, the nozzle 114 may supply a stream 116 of additive material in the form of a powder which may be supplied by a pressurized carrier gas, and the energy source 108 may emit a laser beam 110 to melt the powder to form a thin film of additive material on the build platform 104. With an electron beam additive melting (EBAM) system, the nozzle 114 may supply a stream 116 of additive material in the form of a powder or in the form of a wire or filament, and the energy source 108 may emit an electron beam 110 to melt the powder, wire, or filament to form a thin film of additive material on the build platform 104. With a rapid plasma deposition (RPD) system, the nozzle 114 may supply a stream 116 of additive material in the form of a wire or filament and the deposition chamber 102 may supply an argon gas environment. The energy source 108 may emit a plasma arc 110 to melt the wire or filament to form a thin film of additive material on the build platform 104.

Regardless of the particular DED system, the additive material 116 may be melted by the beam 110 at finite locations to form sequential layers that have a porous structure, and/or sequential contiguous layers may be formed by the applicable additive process with the porous structure being cooperatively or simultaneously formed using an energy source 108 in a subtractive process such as laser ablation.

When an exemplary system 100 includes a powder bed fusion (PBF) system as shown in FIG. 1B, the processing chamber 102 may embody an enclosure which may or may not provide a negative pressure environment. The additive material source 106 may include a roller 118 configured to supply a layer of additive material in the form of a powder, while the energy source 108 emits a beam 110 that melts or sinters the powdered additive material 120 to form a thin film on the build platform 104. With a selective laser sintering (SLS) system or a directed metal laser sintering (DMLS) system, the powdered additive material is sintered by the beam 110 from the energy source layer by layer as the roller 118 applies sequential layers of additive material. With a direct metal laser melting (DMLM) system or a selective laser melting (SLM) system, the powdered additive material is typically fully melted, as opposed to being sintered, as the roller 118 applies sequential layers of additive material in a layer by layer fashion. Regardless of the particular PBF system, the additive material 116 may be melted or sintered by the beam 110 at finite locations to form sequential layers that have a porous structure, and/or sequential contiguous layers may be formed by the applicable additive process with the porous structure being cooperatively or simultaneously formed using an energy source 108 in a subtractive process such as laser ablation.

When an exemplary system 100 includes a laminated object manufacturing (LOM) system as shown in FIG. 1C, the processing chamber 102 may embody an enclosure which may or may not provide a negative pressure environment. The additive material source 106 may include a spool 122 configured to supply additive material in the form of a film, sheet, ribbon, or foil 124, which may be coated with an adhesive. The energy source 108 emits a beam 110 that cuts a pattern in the film, sheet, ribbon, or foil 124. Sequential layers of the film, sheet, ribbon, or foil 124 of additive material are applied one on top of the other as the remainder thereof is drawn past the build platform by a take-up spool 126. Regardless of the particular LOM system, the additive material may be cut by the beam 110 to form sequential layers that have a porous structure, and/or sequential contiguous layers may be formed by the applicable additive process with the porous structure being cooperatively or simultaneously formed using an energy source 108 in a subtractive process.

Any desired additive materials may be used to manufacture a porous tool using an appropriate exemplary porous-tool manufacturing system 100. Exemplary additive materials include metals or metal alloys, and composites such as ceramic matrix composite (CMC) materials. Exemplary metals or metal alloys include tungsten, aluminum, copper, cobalt, molybdenum, tantalum, titanium, nickel, and combinations thereof, as well as superalloys, such as austenitic nickel-chromium-based superalloys. Exemplary CMC materials include silicon carbide, silicon, silica, or alumina matrix materials and combinations thereof. Ceramic fibers may be embedded within the matrix, such as oxidation stable reinforcing fibers including monofilaments such as sapphire and silicon carbide (SiC), yarn including silicon carbide, alumina silicates, and chopped whiskers and fibers, and optionally ceramic particles (e.g., oxides of Si, Al, Zr, Y, and combinations thereof) and inorganic fillers (e.g., pyrophyllite, wollastonite, mica, talc, kyanite, and montmorillonite). As further examples, the CMC materials may also include silicon carbide (SiC) or carbon fiber cloth. In some embodiments, CMC materials may include carbon-fiber-reinforced carbon (C/C), carbon-fiber-reinforced silicon carbide (C/SiC), or silicon-carbide-reinforced silicon carbide (SiC/SiC).

Figure 2A:
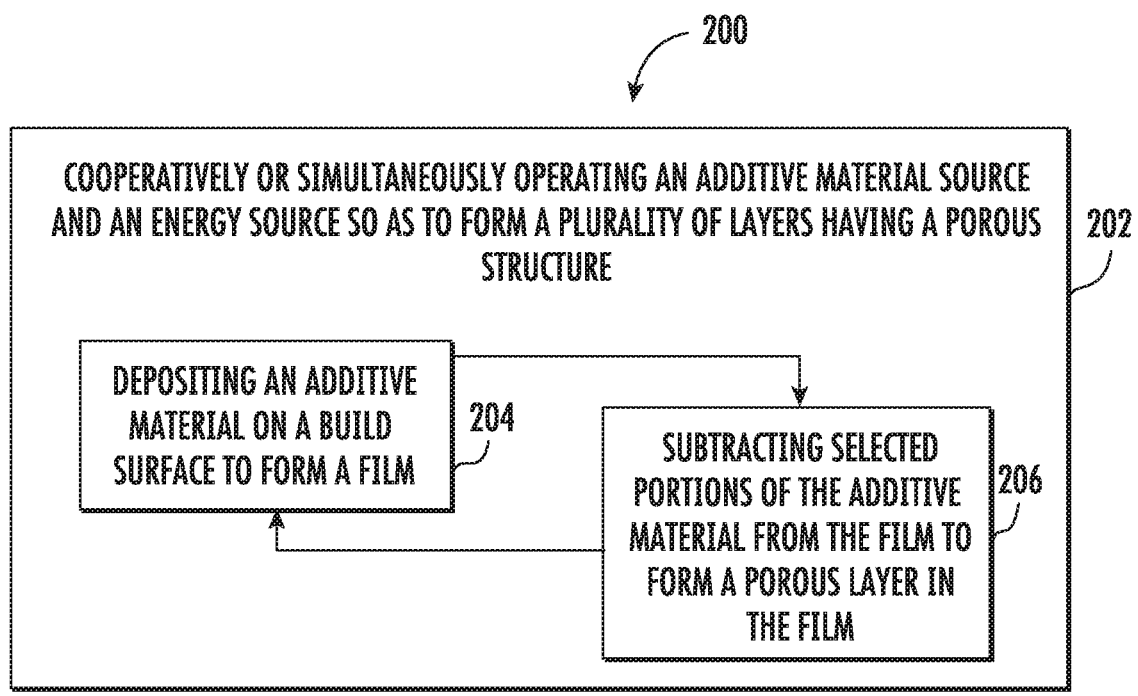

Now turning to FIGS. 2A-2C, an exemplary methods of forming a porous tool 112 will be discussed. An exemplary method 200 of forming a porous tool 112 may be performed using a porous-tool manufacturing system 100. As shown in FIG. 2A, an exemplary method 200 includes cooperatively or simultaneously operating an additive material source and an energy source so as to form a plurality of layers having a porous structure 300. The exemplary method 200 may include depositing an additive material on a build surface to form a film 204 while simultaneously subtracting selected portions of the additive material from the film to form a porous layer in the film 206. Additionally, or alternatively, the exemplary method 200 may include depositing an additive material on a build surface to form a film 204 while followed by subtracting selected portions of the additive material from the film to form a porous layer in the film 206. The depositing of additive material may be performed using a directed energy deposition system and the subtracting selected portions of the additive material may be performed using laser ablation. The method 200 may be carried out in a processing chamber 102, such as a deposition chamber that provides a negative pressure environment, or an enclosure which may or may not provide a negative pressure environment. The porous tool 112 may be formed on a build platform 104 located within the processing chamber 102.

Figure 2B:
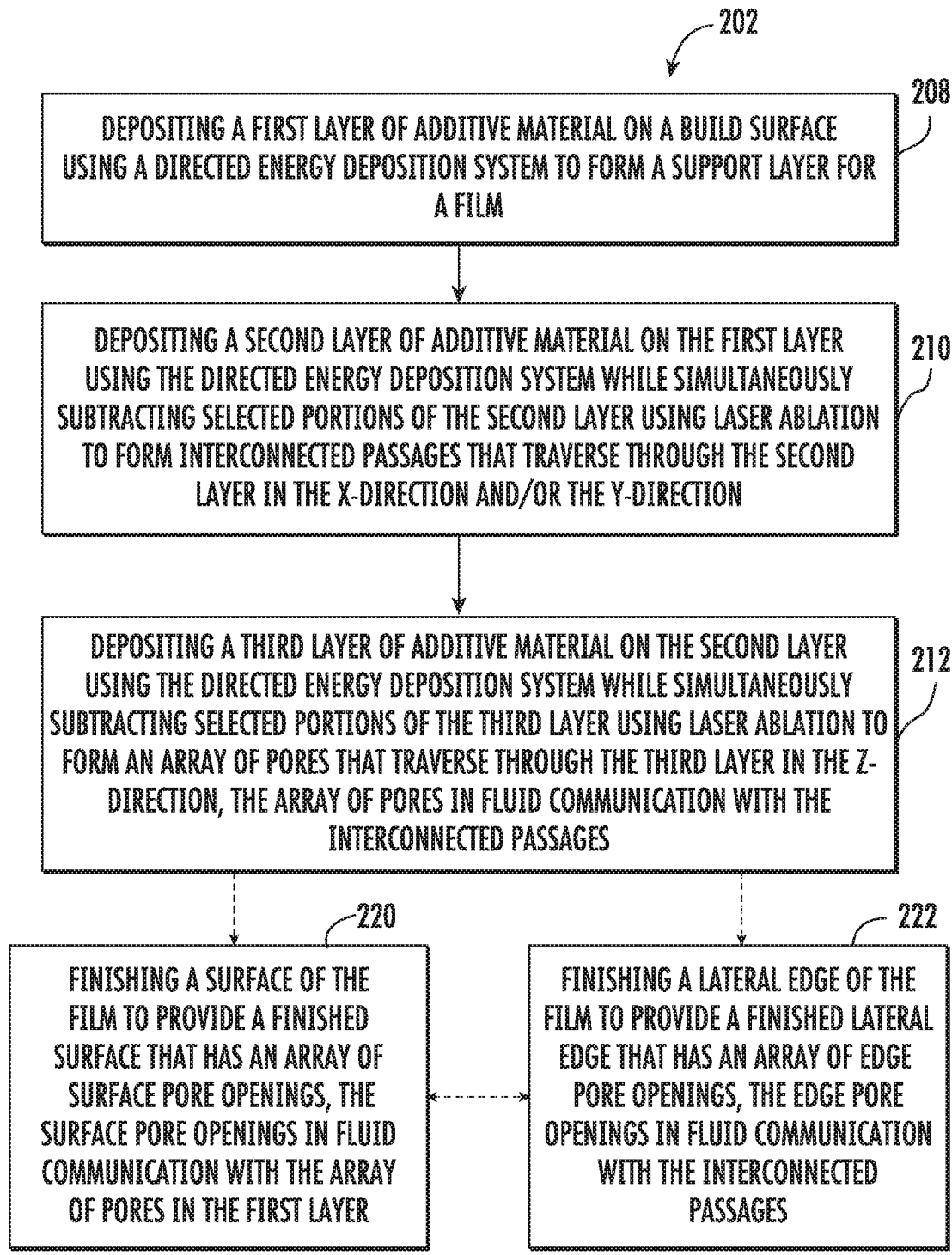
Figure 2C:
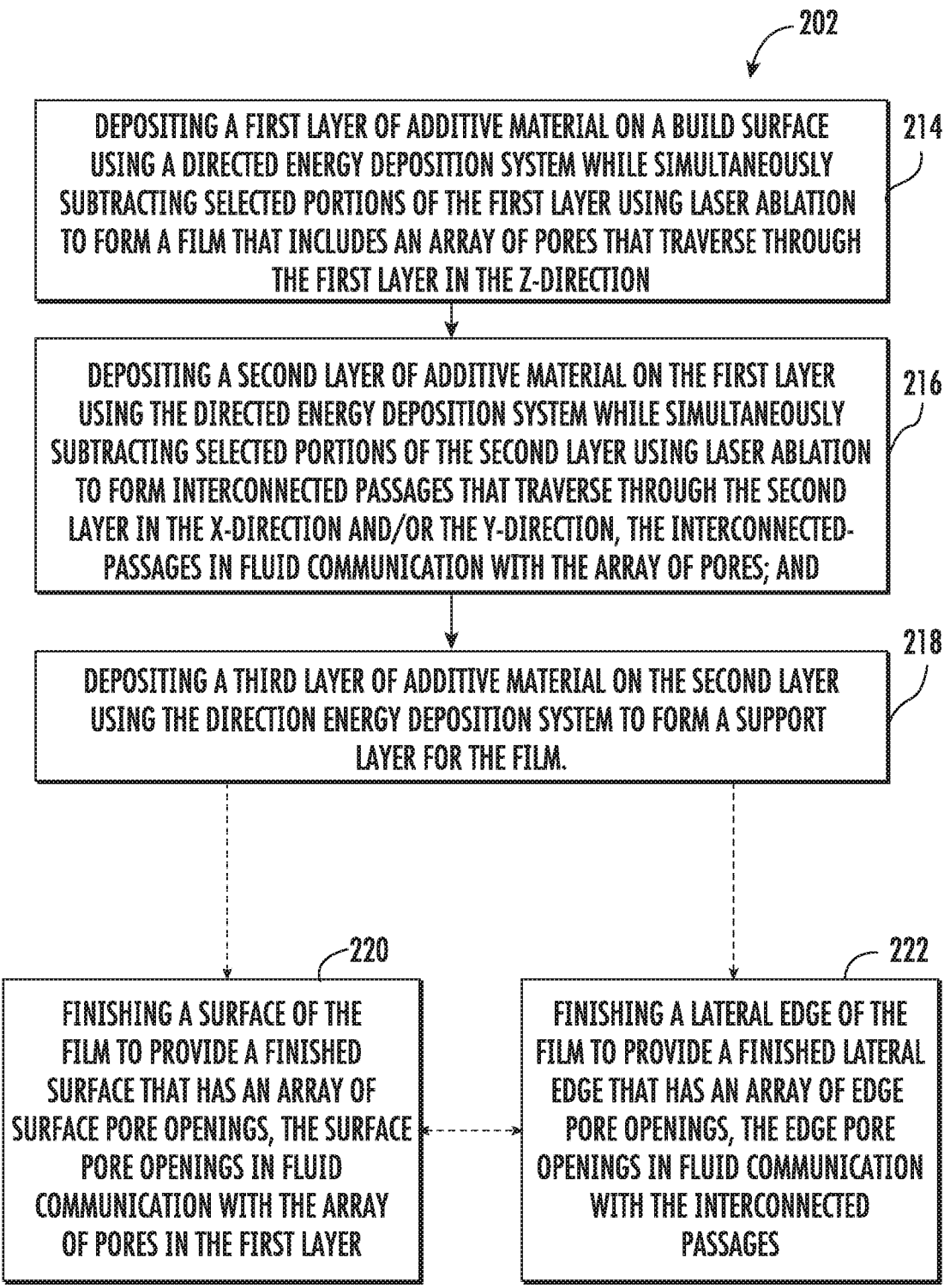

FIGS. 2B and 2C show exemplary embodiments of forming a plurality of layers having a porous structure 300 according to the exemplary method 200 of forming a porous tool 112. As shown in FIG. 2B, in some embodiments, forming a plurality of layers having a porous structure 300 may include depositing a first layer of additive material on the build surface using the directed energy deposition system to form a support layer for the film 208. A second layer of additive material may be deposited on the first layer using the directed energy deposition system while simultaneously subtracting selected portions of the second layer using laser ablation to form interconnected passages that traverse through the second layer in the x-direction and/or the y-direction 210. A third layer of additive material may be deposited on the second layer using the directed energy deposition system while simultaneously subtracting selected portions of the third layer using laser ablation to form an array of pores that traverse through the third layer in the z-direction, such that the array of pores are in fluid communication with the network of interconnected passages 212.

As shown in FIG. 2C, in some embodiments a plurality of layers having a porous structure may be formed 202 according to an exemplary method 200 that includes depositing a first layer of additive material on the build surface using the directed energy deposition system while simultaneously subtracting selected portions of the first layer using laser ablation to form an array of pores that traverse through the first layer in the z-direction 214. A second layer of additive material may be deposited on the first layer using the directed energy deposition system while simultaneously subtracting selected portions of the second layer using laser ablation to form interconnected passages that traverse through the second layer in the x-direction and/or the y-direction, such that the interconnected passages in fluid communication with the array of pores 216. A third layer of additive material may be deposited on the second layer using the directed energy deposition system to form a support layer for the film 218.

In some embodiments, an exemplary method 200 may include finishing a surface of a film to provide a finished surface that has an array of surface pore openings, with the surface pore openings in fluid communication with the array of pores in the first layer 220. Additionally, or in the alternative, an exemplary method 200 may include finishing a lateral edge of the film to provide a finished lateral edge that has an array of edge pore openings, with the edge pore openings in fluid communication with the interconnected passages 222. A surface and/or a lateral edge may be finished using an energy source 108 in a subtractive process, a polishing tool, and/or any other suitable finishing tool.

In some embodiments, an exemplary method 200 may include separating the film from the build surface and attaching the film to a mold body, such that the porous tool includes the mold body with the film attached thereto. Additionally, or in the alternative, an exemplary method 200 may include depositing additional additive material on the film to form a mold body, for example, using the directed energy deposition system. In some embodiments, the build surface may be formed by depositing additive material on a build platform using the directed energy deposition system. The build surface may define a support layer for the film.

In still further exemplary embodiments, the plurality of layers may be formed at least in part by supplying an additive material from an additive material source and additively forming sequential layers of the additive material on a build platform. In some embodiments, the one or more porous structures may be formed utilizing the energy source 108 in an additive process, such as reacting, sintering, melting, or curing the additive material. The energy source 108 may be utilized in such additive process when additively forming the sequential layers so as to form the porous structure at least in part via the additive process. Additionally, or in the alternative, the one or more porous structures may be formed utilizing the energy source 108 in a subtractive process, such as ablation, evaporation, sublimation, and/or micromachining the sequential layers of additive material. The one or more porous structures formed according to the exemplary method 200 may include a porous surface having an array of surface pore openings, and the array of surface pore openings may lead to an array of pores and/or a network of interconnected passages. The array of pores and/or network of interconnected passages may be configured to allow outgas to escape from one or more moldable materials, such as composite or additive manufacturing materials, during a composite fabrication and/or additive manufacturing process while the one or more moldable materials are conformed to the porous surface of the porous tool.

In an exemplary embodiment, the additive process includes a directed energy deposition (DED) system, such as a chemical vapor deposition (CVD) system, a laser engineered net shape (LENS) system, an electron beam additive melting (EBAM) system, or a rapid plasma deposition (RPD) system. For example, in one embodiment, the exemplary method 200 includes additively forming sequential layers of an additive material using a directed energy deposition (DED) system, and cooperatively or simultaneously forming a porous structure in the sequential layers using the energy source in a subtractive process, such as laser ablation, evaporation, sublimation, or micromachining. Additionally, or in the alternative, a porous tool 112 may be formed according to an exemplary method 200 using any other porous-tool manufacturing system 100. As examples, the porous tool 112 formed according to the exemplary method 200 may embody a filter and/or a layup tool that has an integrally formed porous structure.

Figure 3A:
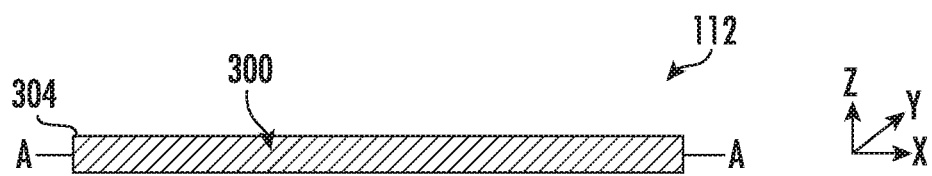
Figure 3B:
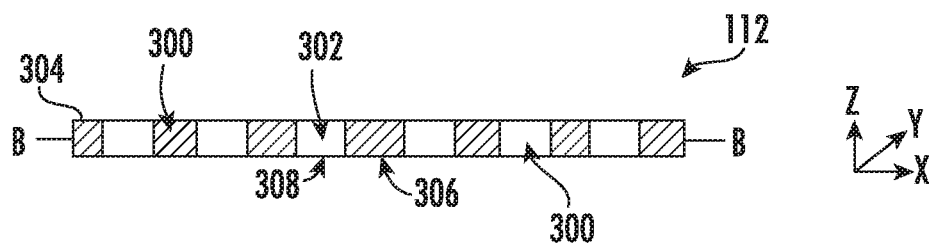
Figure 3C:
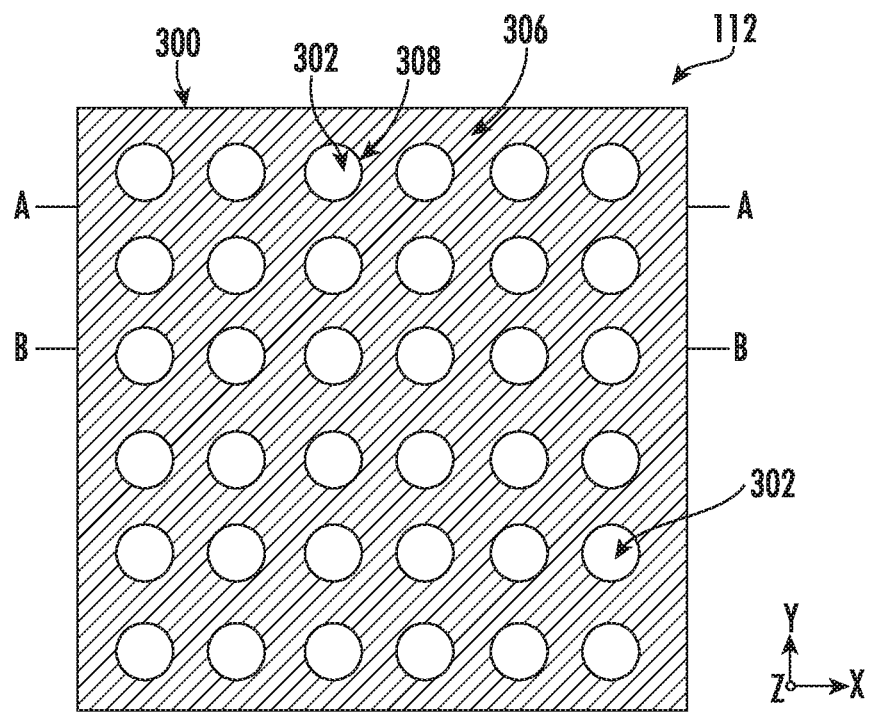
Figure 3D:
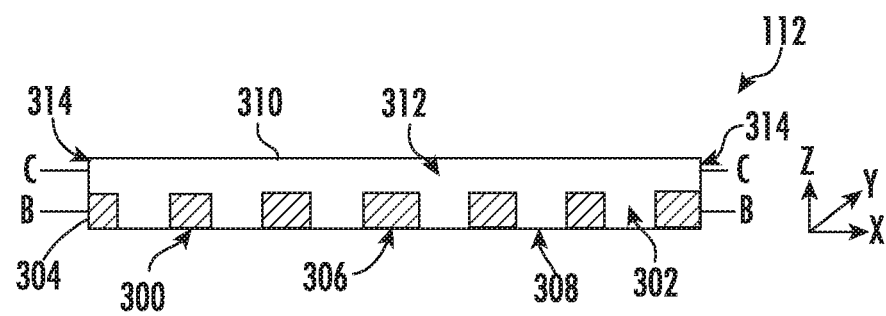
Figure 3E:
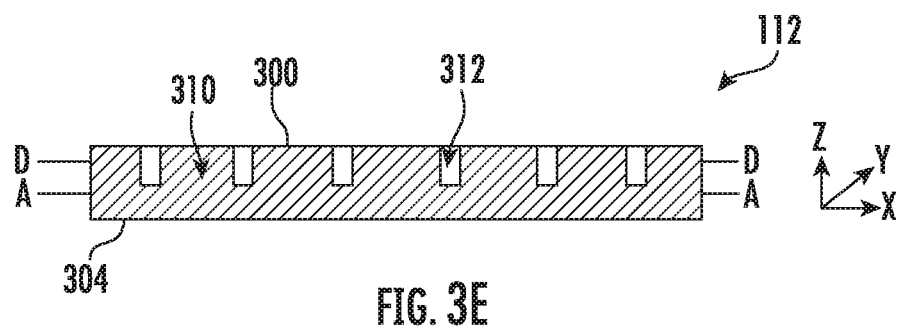
Figure 3F:
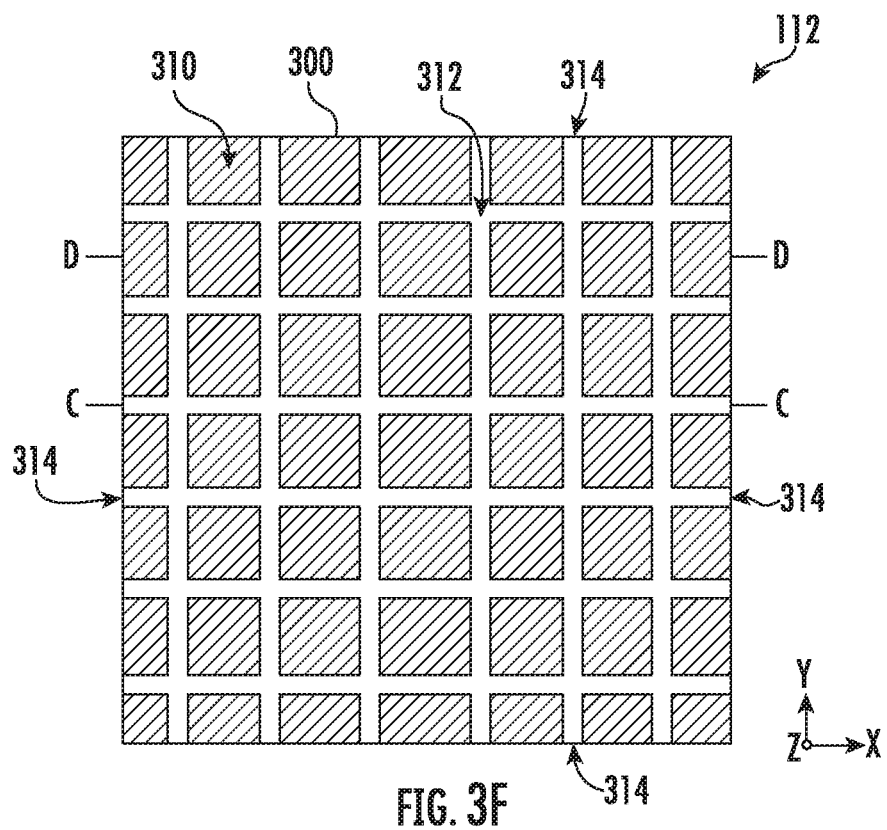
Figure 3G:
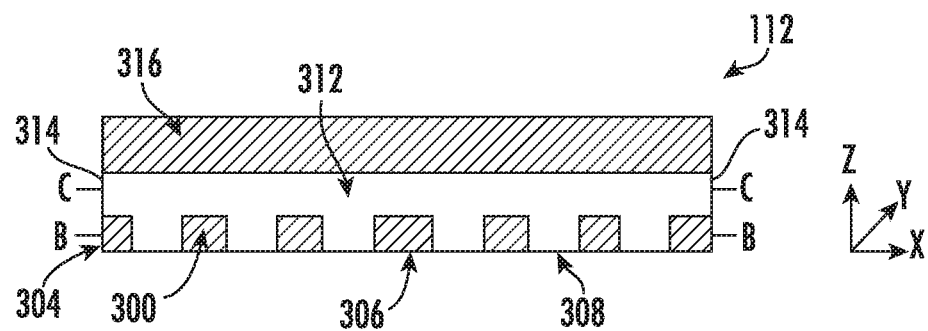
Figure 3H:
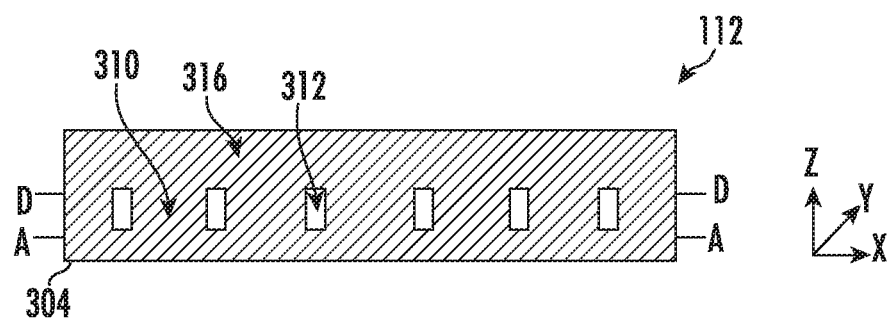
Figure 3I:
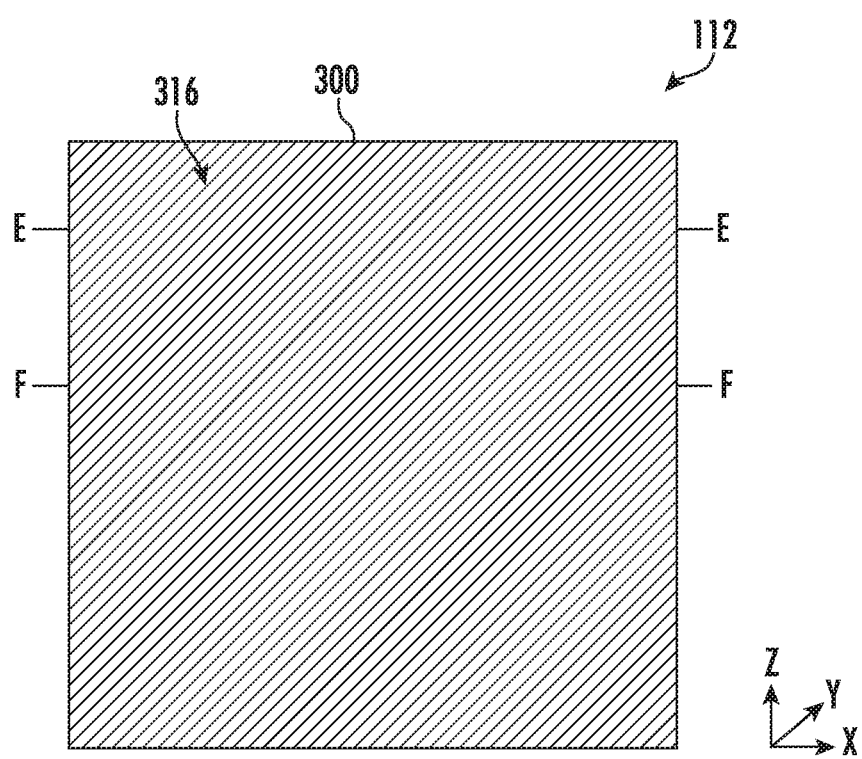

Now turning to FIGS. 3A-3I, an exemplary porous tool 112 will be discussed. FIGS. 3A-3I show a series of cross-sectional views of an exemplary porous tool 112. In some embodiments, the cross-sectional views shown in FIGS. 3A-3I may correspond to steps in an exemplary method of forming the porous tool 112. Any porous-tool manufacturing system 100 may be used to form a porous tool 112 including the exemplary embodiments described herein. FIGS. 3A-3C show cross-sectional views of one embodiment of a porous tool 112, and/or a first layer of a porous tool 112. FIGS. 3D-3F show cross-sectional views of another embodiment of a porous tool 112, and/or a second layer of the porous tool 112. FIGS. 3G-3I show cross-sectional views of yet another embodiment of a porous tool 112, and/or a third layer of the porous tool 112. The respective cross-sectional views are shown with reference to a Cartesian coordinate system. It will be appreciated that the exemplary porous tool 112 shown in the respective cross-sections may be rotated about the Cartesian coordinate system without departing from the spirit and scope of the present disclosure.

The porous tool 112 includes a porous structure 300. The porous structure may include one or more porous layers that have an array of pores, apertures, holes, slits, openings, passages, slots, or the like, or combinations thereof, which are sometimes collectively referred to herein as an array of pores 302. In the exemplary embodiment shown in FIGS. 3A-3I, the porous structure 300 includes an additively-manufactured film. As shown in FIGS. 3A-3C, a first porous layer 304 of a porous tool 112 such as an additively-manufactured film includes a porous surface 306 having an array of surface pore openings 308, with each one of the respective surface pore openings 308 leading to a corresponding pore 302 within the porous structure 300 of the film. The porous surface 306 may include one or more contours configured to conform a moldable material, such as a composite or additive manufacturing material, to a shape defined by the one or more contours. The one or more contours may be configured in any manner corresponding to the shape of a component to be formed using the porous tool 112. While cross-sectional view of the porous surface 306 are generally shown as having linear contours, it will be appreciated that the one or more contours may include any desired curve, corner, shape or plane that may correspond to all or a portion of the shape of the component to be formed using the porous tool 112. The porous structure 300 may be configured to allow outgas to escape from the one or more moldable materials during processes such as debulking, autoclaving, curing, pyrolysis, and/or other processes associated with molding, composite fabrication, and/or additive manufacturing. The array of pores 302 may be configured and arranged so as to traverse through the porous structure 300, such as through the first porous layer 304 of the porous structure 300, in any desired direction or directions, including in the z-direction as shown in FIGS. 3A-3C. In some embodiments, a porous tool 112 may include a porous structure 300 that defines an array of surface pore openings 308 leading to an array of pores 302 that traverse the porous structure 300.

A porous tool 112 may additionally or alternatively include a porous structure 300 such as an additively-manufactured film that has further layers in combination with the first porous layer 304 as described herein. For example, as shown in FIGS. 3D-3F, a second porous layer 310 may be formed on top of or beneath the first porous layer 304 of the porous tool 112. The porous openings 308 may provide fluid communication with a network of interconnected passages 312 defined by the second porous layer 310 and/or the first porous layer 304. The network of interconnected passages 312 provide fluid communication with a plurality of edge pore openings 314. The edge pore openings 314 may be located along any one or more lateral edges of the film. As shown in FIGS. 3D-3F, the surface pore openings 308 are in fluid communication with the edge pore openings 314 by way of the array of pores 302 and the network of interconnected passages 312.

The network of interconnected passages 312 may be configured and arranged so as to traverse through the porous structure 300, such as through the second porous layer 310 and/or the first porous layer 304 of the porous structure 300, in any desired direction or directions, including in the x- and/or y-direction as shown in FIGS. 3D-3E. In some embodiments, a porous tool 112 may include a porous structure 300 that defines an array of surface pore openings 308 leading to an array of pores 302 which provide fluid communication to a network of interconnected passages 312 that traverse the porous structure 300 to an array of edge pore openings 314 located at one or more lateral edges of the porous structure 300. The array of pores may traverse the porous structure 300, such as a first porous layer 304 and/or a second porous layer 310 of the porous structure 300, in a first direction, such as a z-direction. The network of interconnected passages 312 may traverse the porous structure 300, such as the second layer 310 and/or a first layer 304, in a second direction, such as an x-direction, and/or a third direction, such as a y-direction. Together, the array of pores 302 and the network of interconnected passages 312 provide a contiguous pathway from the surface pore openings 308 at the porous surface 306 of the porous tool 112 to the edge pore openings 314 at one or more lateral edges. Outgas may flow through such contiguous pathway such as during processes such as debulking, autoclaving, curing, pyrolysis, and/or other processes associated with molding, composite fabrication, and/or additive manufacturing.

The edge pore openings 314 may be positioned at one or more lateral edges at a location that allows for the porous tool 300 to include a substantially nonporous layer. As shown in FIGS. 3G-3I, a porous tool 112 may include a third layer 316 which provides support to the porous structure 300. The third layer 316 may include a nonporous support layer. The third layer 316 may be formed on top of the second layer 310 of the porous tool 112. The third layer 316 may be substantially nonporous, in that the porous structure does not traverse the third layer 316. In some embodiments, the third layer 316 may serve as a support layer for the porous tool 112. For example, in some embodiments, a porous tool 112 may include a porous structure 300 that includes an additively-manufactured film which has a porous layer (e.g., the first porous layer 304 and/or the second porous layer 310) and a nonporous layer (e.g., the third layer 316). The porous layer may include a porous surface 306 with an array of surface pore openings 308, a network of interconnected passages 312 in fluid communication with the surface pore openings 308, and one or more lateral edges that have an array of edge pore openings 314 in fluid communication with the network of interconnected passages 312. The porous tool may include an array of pores 302 that provide fluid communication between the surface pore openings 308 and the network of interconnected passages 312. The additively-manufactured film or porous structure 300 may include a substantially nonporous layer (e.g., the third layer 316) on one or more sides thereof.

Figure 4A:
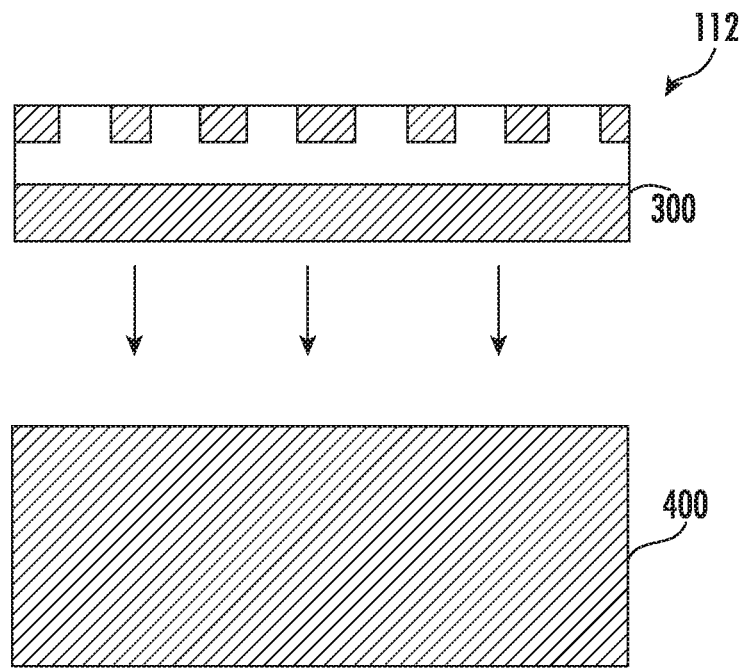
FIGS. 4A and 4B show cross-sectional views of exemplary porous tools that include a porous structure and a mold body.
Figure 4B:
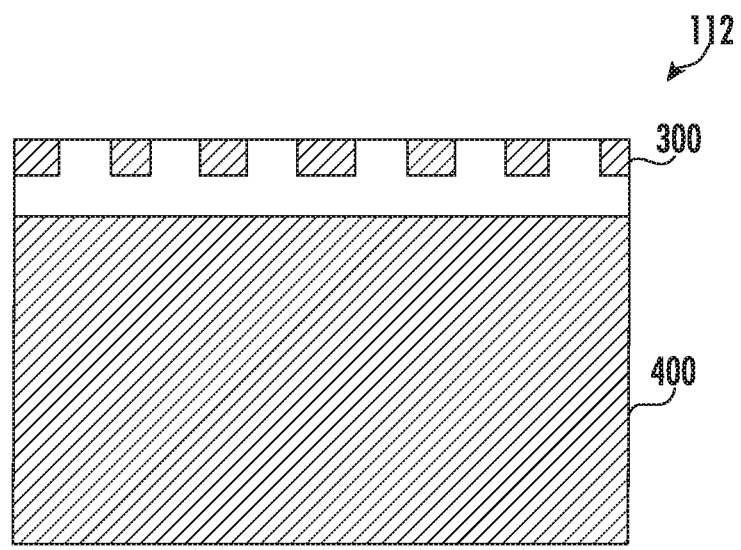

Now turning to FIGS. 4A and 4B, an exemplary porous tool 112 may include a porous structure 300 such as an additively-manufactured film and mold body 400. The porous structure 300 may be attached to the mold body 400 such as with a suitable adhesive, as shown in FIG. 4A. Alternatively, the porous structure 300 may be integrally formed as part of the mold body 400, or vice versa, as shown in FIG. 4B. In some embodiments, the porous tool 112 may include a porous structure 300 such as a porous film with one or more porous layers 304, 310 as shown in FIGS. 3A-3C and/or 3D-3F, and a nonporous layer 316 as shown in FIGS. 3G-3I. In some embodiments, the porous tool 112 may at least in part embody a layup tool that includes an integrally formed porous structure 300 as described herein. For example, the layup tool may include an array of pores 302 and/or a network of interconnected passages 312, such as shown in FIGS. 3A-3C and/or 3D-3F. The layup tool may additionally include a substantially nonporous layer 316 such as shown in FIGS. 3G-3I. Exemplary porous tools 112 may be used as a filter and/or a layup tool in a molding process, such as a composite fabrication and/or additive manufacturing system, so as to allow outgas to escape from a moldable material (e.g., a composite or additive manufacturing material) during various processing steps such as debulking, autoclaving, curing, and/or pyrolysis. The presently disclosed porous structures advantageously avoid pores that dead-end or otherwise fall short of their desired depth, thereby improving outgas evacuation as described herein.

A porous-tool manufacturing system 100 may be configured to form a porous tool 112 that includes a porous structure 300 having any desired configuration and arrangement, as well as any desired geometry and size. The configuration, arrangement, geometry, and/or size of the pores 302 may be selected according to the desired porous properties of the porous tool 112. The desired properties of the porous tool 112 may be obtained by selectively forming the porous tool with an array of pores having a given configuration, arrangement, geometry, and or size. In some embodiments, a porous tool 112 may be configured to provide a desired mass flux of outgas a given temperature and pressure. The porous layer (e.g., the first porous layer 304 and/or the second porous layer 310) may include pores 302 and/or a network of interconnected passages 312 configured and arranged in any desired pattern or combination of patterns, including patterns that embody an ordered array or a random or semi-random array. The surface pore openings 308, the pores 302, the interconnected passages 312, and/or the edge pore openings 314 may have any desired configuration, shape, and/or size. In some embodiments, surface pore openings 308, pores 302, interconnected passages 312, and/or edge pore openings 314 may have a cross-sectional shape that includes one or more of the following profiles: circular, semi-circular, oval, ellipses, crescent, curvilinear, polygonal, irregular, random, semi-random, and/or combinations thereof.

In some embodiments, surface pore openings 308, pores 302, interconnected passages 312, and/or edge pore openings 314 may have an average cross-sectional width of 1 to 1,000 microns, such as 25 to 750 µm, such as 50 to 750 µm, such as 100 to 750 µm, such as 250 to 750 µm, such as 150 to 500 µm, such as 250 to 750 µm, such as 500 to 750 µm, such as 750 to 1,000 µm, such as 1 to 250 µm, such as 5 to 150 µm, such as 10 to 100 µm, such as 1 to 75 µm, such as 5 to 50 µm, such as 1 to 25 µm, or such as 5 to 25 µm. The surface pore openings 308, pores 302, interconnected passages 312, and/or edge pore openings 314 may have an average cross-sectional width of at least 1 micron, such as least 5 such as least 10 such as least 25 such as least 50 such as least 100 µm, as least 150 µm, such as least 200 µm, as least 250 µm, as least 350 µm, as least 500 µm, as least 750 or µm, as least 900 µm. The surface pore openings 308, pores 302, interconnected passages 312, and/or edge pore openings 314 may have an average cross-sectional width of at 1,000 micron or less, such as 900 µm or less, such as 750 µm or less, such as 500 µm or less, such as 350 µm or less, such as 250 µm or less, such as 200 µm or less, such as 150 µm or less, such as 100 µm or less, such as 50 µm or less, such as 25 µm or less, such as 10 µm or less, or such as 5 µm or less.

In some embodiments, a porous tool 112 may include a support layer such as the third layer 316 shown in FIGS. 3G-3I. The support layer may have any desired thickness, such as from 1 to 25 millimeters, such as from 1 to 10 mm, such as from 2.5 to 10 mm, such as from 2.5 to 5 mm, such as from 5 to 20 mm, such as from 10 to 25 mm, such as from 15 to 25 mm. The support layer may have a thickness of at least 1 millimeter, such as at least 2 mm, such as at least 6 mm, such as at least 12 mm, such as at least 16 mm, such as at least 22 mm. The support layer may have a thickness of less than 25 millimeters, such as less than 21 mm, such as less than 17 mm, such as less than 13 mm, such as less than 9 mm, such as less than 7 mm, such as less than 3 mm.

Figure 5A:
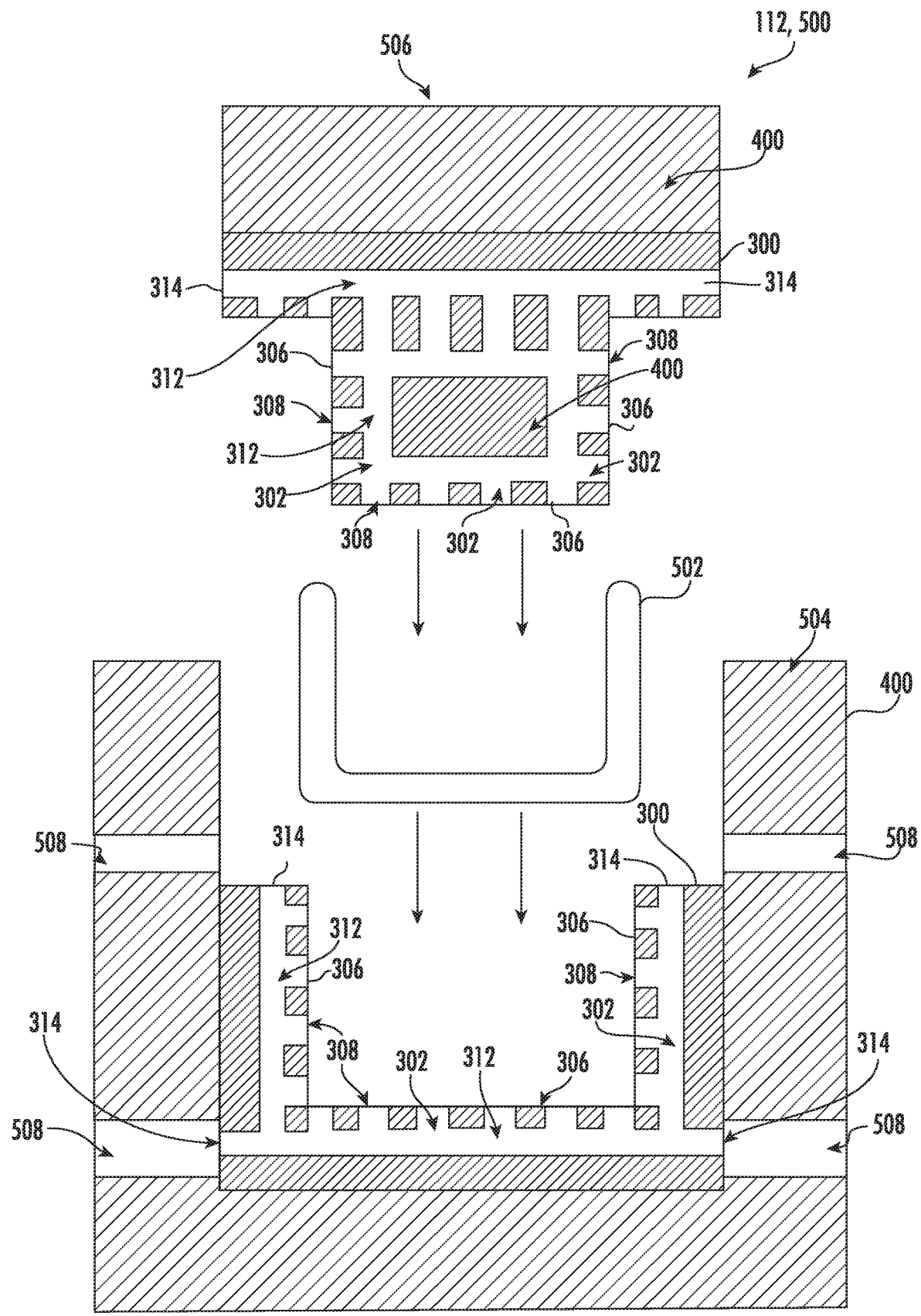
FIGS. 5A and 5B show cross-sectional views of another exemplary porous tool being used to conform a moldable material to a shape defined by one or more contours of the porous tool.
Figure 5B:
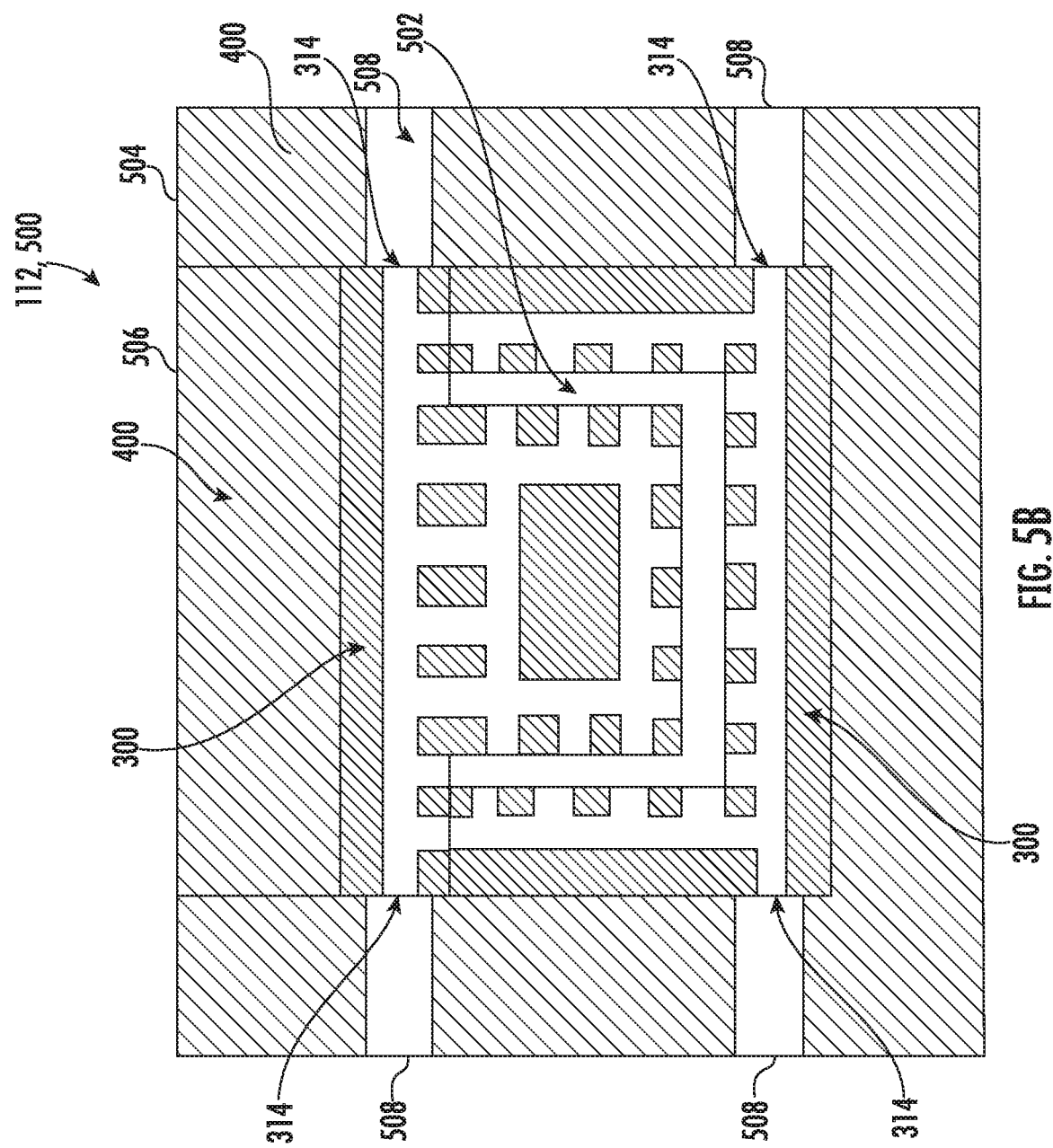

Now turning to FIGS. 5A and 5B, another exemplary porous tool 112, such as a layup tool 500 is shown. The layup tool 500 may be used in a molding process, such as a composite fabrication and/or additive manufacturing process, to form a molded component, such as a composite or additively manufactured component. For example, one or more moldable materials (e.g., composite or additive manufacturing materials) 502 may be conformed to a shape defined by a layup tool 500. The layup tool 500 includes a porous structure 300 as described herein. The layup tool 500 may include one or more mold bodies 400 such as one or more molds or mandrels. As shown in FIGS. 5A and 5B, an exemplary layup tool 500 includes a first mold body 504 and/or a second mold body 506. The first mold body 504 may include an external mold body 400, and the second mold body 506 may include an internal mold body 400. A mold body may include one or more outgas vents 508. The outgas vents 508 may align with one or more of the lateral edge pores 314 so as to provide a pathway for outgas to flow from the lateral edge pores 314 through the mold body 504, 506. Each of the one or more outgas vents 508 may align with one or more of the lateral edge pores 314. For example, each lateral edge pore 314 need not have an individually corresponding outgas vent 508, but instead one outgas vent may provide a pathway for outgas to flow from a plurality of lateral edge pores. However, in some embodiments the outgas vents 508 may be regarded as an extension of the network of interconnected passages 312, for example, with each lateral edge pore 314 having a corresponding outgas vent 508. In some embodiments, the outgas vents 508 may have a larger cross-sectional width relative to a corresponding lateral edge pore 314. Such relatively larger outgas vents 508 may allow for easy alignment of the lateral edge pores with the outgas vents in embodiments where a porous structure 300 is adhered to a mold body 400 as shown in FIG. 4A. Additionally, or in the alternative, outgas vents 508 may allow for easier cleaning and/or minimize accumulation of contamination or deposited material from blocking the outgas vents. In some embodiments, the outgas vents 508 may include a porous structure such as network of interconnected passages similar to that shown in FIGS. 3A-3I. In some embodiments, one or more outgas vents 508 may be configured to interface with a process fitting, such as a fitting that supplies negative pressure to the porous structure. Such negative pressure may help evacuate outgas and/or conform the one or more moldable materials 502 to a shape defined by one or more contours of the porous surface 306 of the layup tool 500.

A molded component, such as a composite or additively manufactured component, may be formed from the one or more moldable materials 502 using a porous tool 112 that includes an external mold body 504 and/or an internal mold body 506. When forming a molded component using a porous tool 112 such as a layup tool 500, the moldable materials 502 are conformed to a porous surface 308 of the porous tool 112. An external mold body 504 and an internal mold body 506 may be configured to be used together with one another as a system to form a molded component. Alternatively, or in addition, an external mold body 504 or an internal mold body 506 may be configured to be used individually or separately from one another, such as in separate processes or separate steps of a process.

In some embodiments, as shown in FIG. 5B, a layup tool 500 may include an internal mold body 506 that becomes "trapped" within the molded component formed from the moldable materials 502. The internal mold body 506 may be removed using a mechanical and/or chemical process. For example, the layup tool 500 (e.g., the internal mold body 506) may be formed from a ceramic material which may be leached out using a caustic or acidic solution, optionally under elevated temperature and/or pressure.

Figure 6:
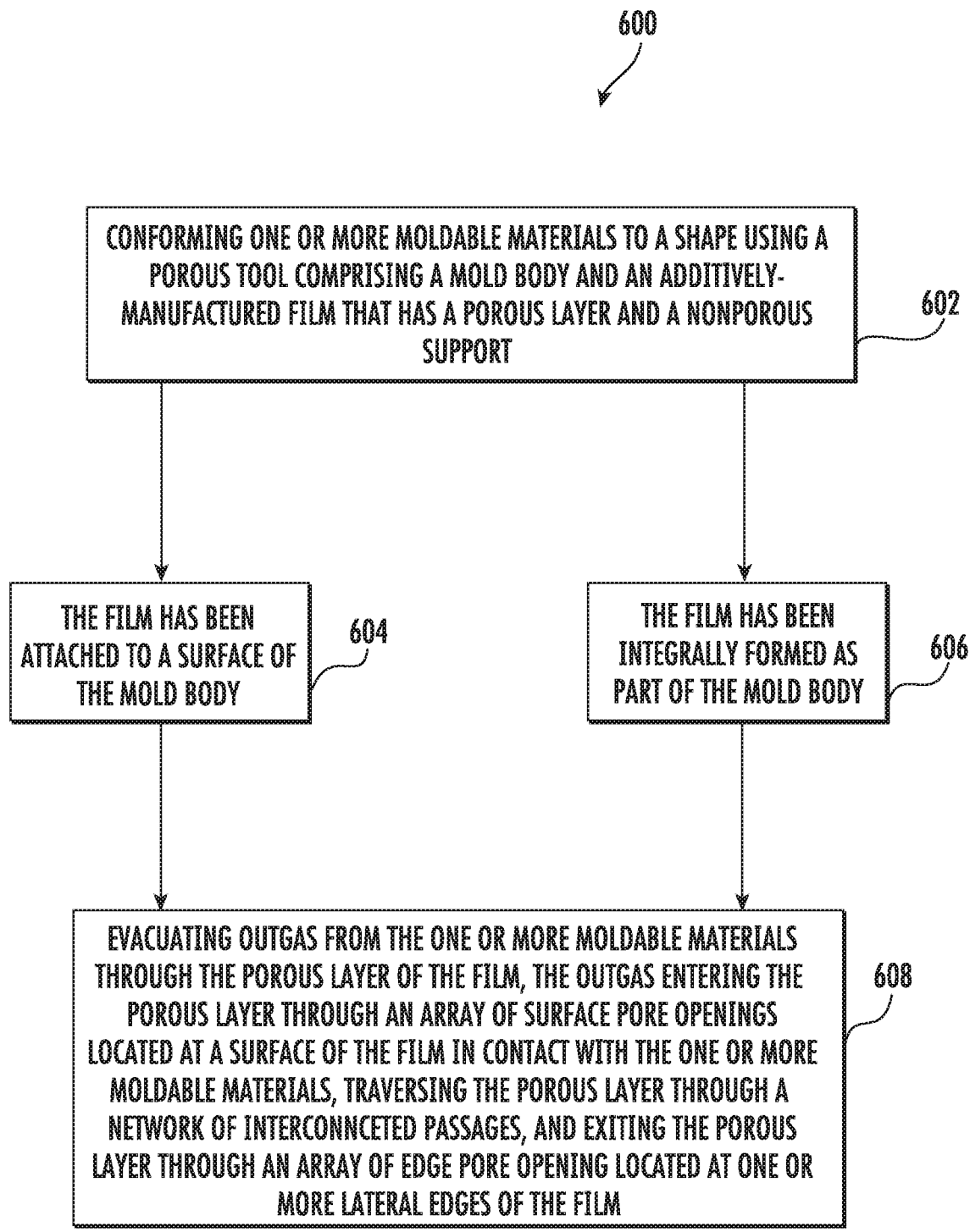
FIG. 6 is a flow chart depicting steps in an exemplary method of forming a composite or additively manufactured component using a porous tool.

The porous tool 112 may be used to form a molded component, such as a composite or additively manufactured component. To form a molded component, one or more moldable materials 502 may be conformed to the shape of the layup tool 500, including an external mold body 504 and/or an internal mold body 506. For example, a composite or additively manufactured component may be formed according to an exemplary method 600 shown in FIG. 6. An exemplary method 600 includes conforming one or more moldable materials (e.g., composite or additive manufacturing materials) to a shape defined by a porous tool 602. The porous tool may include a mold body and an additively-manufactured film that has a porous layer and a nonporous support. The film may have been attached to a surface of the mold body 604, or the film may have been integrally formed as part of the mold body 606. Regardless of whether the film is attached to a surface of the mold body or integrally formed as part of the mold body, the exemplary method includes evacuating outgas from the one or more moldable materials through the porous layer of the film 608. The outgas may the porous layer through an array of surface pore openings located at a surface of the film in contact with the one or more moldable materials. The outgas may then traverse the porous layer through a network of interconnected passages, and exit the porous layer through an array of edge pore openings located at one or more lateral edges of the film. The porous tool may include a layup tool, and the exemplary method 600 may include forming an external surface using an external mold body 602 and/or forming an internal surface using an internal mold body 604, and evacuating outgas from the moldable materials through the porous structure of the layup tool 606. The exemplary method may include evacuating outgas through one or more outgas vents 508 in the porous tool. In some embodiments, the exemplary method 600 may include removing an internal mold body that has become trapped within the composite or additively manufactured component, such as by way of leaching with a caustic or acidic solution, optionally under elevated temperature and/or pressure.

The presently disclosed porous tools 112 may be used to form any molded component from any one or more moldable materials 502, including plastics, composites, and metal alloys, as well as combinations thereof. In some embodiments, the moldable materials 502 may include ceramic matrix composite (CMC) materials. CMC materials include a ceramic matrix material and reinforcing fibers or cloth. Exemplary ceramic matrix materials include silicon carbide (SiC) and/or carbon (C). Exemplary CMC materials include carbon-fiber-reinforced carbon (C/C), carbon-fiber-reinforced silicon carbide (C/SiC), or silicon-carbide-reinforced silicon carbide (SiC/SiC).

In some embodiments, the moldable materials 502 may include polymer matrix composite (PMC) materials. PMC materials include a polymeric matrix material and reinforcing fibers or cloth. Exemplary PMC materials include fiber-reinforced plastics and advanced composites. Exemplary polymeric matrix materials include thermosets, such as epoxies, phenolics, polyurethanes, polyimides, bismaleimides, cyanate esters, phenolics, benzoxazines, phthalonitriles. In some embodiments, polyimides may be particularly suitable. Exemplary polyimides include phenylethynyl-terminated imide (PETI) oligomers, biphenyl dianhydride-based 2,2'-dimethylbenzidine, ultrahigh-temperature HFPE. In some embodiments, exemplary polyimides may include end caps, such as 4-phenylethynylphthalic anhydride (PEPA) and/or asymmetric oxydipthhalic anhydride (a-ODPA) end caps.

Exemplary reinforcing fibers or cloth that may be utilized in CMC or PMC materials include carbon fibers, ceramic fibers, fiberglass, graphite fibers, and aramid fibers. Reinforcing fibers or cloth may be formed to the shape or contour of a layup tool 500, and then the fibers or cloth may be infiltrated with a matrix material. Exemplary reinforcing fibers include monofilaments, yarns, chopped whiskers or fibers, and/or particles. In some embodiments, ceramic fibers may be formed of materials such a silicon carbide (SiC), carbon fiber (C), sapphire, alumina silicates, and/or oxides of Si, Al, Zr, Y, as well as combinations thereof. The reinforcing fibers may additionally include inorganic fillers, such as silica, quartz, pyrophyllite, wollastonite, mica, talc, kyanite, and/or montmorillonite, as well as combinations thereof.

Moldable materials such as CMC or PMC materials may be applied to the porous tool 112 (e.g., a layup tool 500) using any molding, composite fabrication, and/or additive manufacturing process. Exemplary processes for forming a component from CMC or PMC materials include chemical vapor deposition (CVD), chemical vapor infiltration (CVI), polymer impregnation and pyrolysis (PIP), melt infiltration (MI), resin transfer molding (RTM), chemical reaction, sintering, or electrophoresis. The porous structure 300 of the porous tool 112 (e.g., the layup tool 500) may be configured to allow outgas to escape from the moldable material during various processing steps of the composite fabrication or additive manufacturing process. Such outgas may be generated, for example, during debulking, autoclaving, curing, and/or pyrolysis processes.

Any desired molded, composite, or additively manufactured component may be formed using any one or more of the presently disclosed porous tools. Accordingly the presently disclosed porous tools may be configured to form any desired molded component, composite component, or additively manufactured component. Exemplary components include those used in turbomachines, including, turbojets, turbofans, turboprops, turboshafts, ramjets, rocket jets, pulse-jets, turbines, gas turbines, steam turbines, marine engines, and the like. As examples, a porous tool may be configured to form a shroud component or a turbine blade for a turbomachine such as a turbofan engine commonly used in aircraft, including commercial, military, and civilian aircraft. In an exemplary embodiment, the component may include a ceramic matrix composite (CMC) material, a polymeric matrix composite (PMC) material, and/or a superalloy. This written description uses exemplary embodiments to describe the presently disclosed subject matter, including the best mode, and also to enable any person skilled in the art to practice such subject matter, including making and using any devices or systems and performing any incorporated methods. The patentable scope of the presently disclosed subject matter is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method of forming a porous tool, the method comprising:
    depositing additive material on a build surface using a directed energy deposition system to form a film while simultaneously subtracting selected portions of the additive material from the film using laser ablation to form a porous layer in the film, the porous layer comprising a network of interconnected passages, and wherein the porous tool comprises:
    a mold body; and
    an additively-manufactured film attached to a surface of the mold body, the additively-manufactured film formed by the depositing of additive material on the build surface, the film comprising a porous layer having a thickness of from 100 to 1,000 microns and a nonporous support layer having a thickness of from 1 to 10 millimeters, the porous layer comprising:
        a surface having an array of surface pore openings;
        a network of interconnected passages in fluid communication with the surface pore openings; and
        one or more lateral edges comprising an array of edge pore openings in fluid communication with the interconnected passages.
2. The method of claim 1, wherein the porous layer comprises:
    a first layer of additive material comprising an array of pores that traverse through the first layer in the z-direction; and
    a second layer of additive material comprising interconnected passages that traverse through the second layer in the x-direction and/or the y-direction, the interconnected passages in fluid communication with the array of pores.

3. The method of claim 2, wherein the pores and/or the interconnected passages have an average cross-sectional width of from 1 to 25 microns.
4. The method of claim 1, wherein the porous tool comprises:
    a mold body, and the additively-manufactured film attached to the mold body, the additively-manufactured film either adhered to the mold body or integrally formed with the mold body.
5. A method of forming a porous tool, the method comprising:
    depositing additive material on a build surface using a directed energy deposition system to form a film while simultaneously subtracting selected portions of the additive material from the film using laser ablation to form a porous layer in the film, the porous layer comprising a network of Interconnected passages, and wherein the porous tool comprises:
    a mold body, and
    an additively-manufactured film attached to a surface of the mold body, the additively-manufactured film formed by the depositing of additive material on the build surface, the film comprising a porous layer having a thickness of from 100 to 1,000 microns and a nonporous support layer having a thickness of from 1 to 10 millimeters; and
    wherein the method further comprising forming a molded component using the porous tool, wherein forming the molded component using the porous tool comprises:
        conforming one or more moldable materials to a shape using the porous tool; and
        evacuating outgas from the one or more moldable materials through the porous layer of the film, the outgas entering the porous layer through an array of surface pore openings located at a surface of the film in contact with the one or more moldable materials, traversing the porous layer through a network of interconnected passages, and exiting the porous layer through an array of edge pore openings located at one or more lateral edges of the film.
6. The method of claim 5, wherein forming the molded component using the porous tool comprises:
    conforming the one or more moldable materials into the shape of a shroud component for a turbomachine or into the shape of a turbine blade component for a turbomachine, the one or more moldable materials comprising a ceramic matrix composite (CMC) material, a polymeric matrix composite (PMC) material, and/or a superalloy.
7. A method of forming a porous tool comprising a mold body, a non-porous support structure on the mold body, and a porous structure on the non-porous support structure, the method comprising:
    forming a non-porous support structure by depositing a layer of additive material using a directed energy deposition system;
    forming an Intermediate porous layer by depositing an intermediate layer of additive material using the directed energy deposition system while simultaneously subtracting selected portions of the intermediate layer using laser ablation to form interconnected passages that traverse through the intermediate layer in the x-direction and/or the y-direction;
    forming a surface porous layer by depositing a layer of additive material using the directed energy deposition system while simultaneously subtracting selected portions of the layer using laser ablation to form an array of pores that traverse through the surface layer in the z-direction, wherein the intermediate porous layer and the surface porous layer form the porous structure; and finishing the porous structure to provide a lateral edge comprising an array of edge pore openings in fluid communication with the interconnected passages and an exterior surface comprising an array of surface pore openings in fluid communication with the array of pores in the surface layer, wherein the array of pores are in fluid communication with the interconnected passages, and wherein one or more of the edge pore openings are aligned with one or more outgas vents positioned in the mold body.

8. The method of claim 7, comprising:
forming the porous structure so as to include one or more contours configured to conform a moldable material to a shaped defined by the one or more contours.

9. The method of claim 7, wherein the directed energy deposition system comprises a chemical vapor deposition (CVD) system, a laser engineered net shape (LENS) system, an electron beam additive melting (EBAM) system, or a rapid plasma deposition (RPD) system.

10. The method of claim 7, wherein the additive material comprises a metal or metal alloy, the metal or metal alloy comprising tungsten, aluminum, copper, cobalt, molybdenum, tantalum, titanium, and/or nickel.

11. The method of claim 7,
wherein the porous structure has a thickness of from 100 to 1,000 microns.

12. The method of claim 7, wherein the non-porous support structure has a thickness of from 1 to 10 millimeters.

13. The method of claim 7, wherein the interconnected passages have an average cross-sectional width of from 1 to 25 microns.

14. The method of claim 7, wherein the surface porous layer is formed on a build surface, the intermediate porous layer is formed on the surface porous layer, and the non-porous support structure is formed on the intermediate porous layer, and wherein the method further comprises separating the porous structure from the build surface prior to finishing the porous structure to provide the array of surface pore openings.

15. The method of claim 14, wherein the mold body is formed by depositing additional additive material on the non-porous support structure using the directed energy deposition system, whereby the mold body, non-porous support structure and porous structure are integrally formed.

16. The method of claim 14, further comprising adhering the non-porous support structure to the mold body.

17. The method of claim 7, wherein the mold body is formed by depositing additional additive material using the directed energy deposition system, the non-porous support structure is formed on the mold body, the intermediate porous layer is formed on the non-porous support structure, and the surface porous layer Is formed on the intermediate porous layer, whereby the mold body, non-porous support structure and porous structure are integrally formed.

18. The method of claim 7, wherein the non-porous support structure is formed on a build platform, the intermediate porous layer is formed on the non-porous support structure, and the surface porous layer is formed on the intermediate porous layer, and wherein the method further comprises separating the non-porous support structure from the build platform and adhering the non-porous support structure to the mold body.

* * * * *